(12) United States Patent
Gross et al.

(10) Patent No.: US 8,706,190 B2
(45) Date of Patent: Apr. 22, 2014

(54) TEMPERATURE MEASUREMENT NEAR AN ICE BALL USING A PROTON RESONANCE FREQUENCY METHOD AND RECALCULATION OF SUSCEPTIBILITY ARTIFACTS

(75) Inventors: Patrick Gross, Langensendelbach (DE); Antje Kickhefel, Moehrendorf (DE); Joerg Roland, Hemhofen (DE); Rares Salomir, Ambilly (FR)

(73) Assignee: Siemens Aktiengesellschaft, Munich (DE)

( * ) Notice: Subject to any disclaimer, the term of this patent is extended or adjusted under 35 U.S.C. 154(b) by 534 days.

(21) Appl. No.: 12/943,381

(22) Filed: Nov. 10, 2010

(65) Prior Publication Data
US 2012/0116208 A1 May 10, 2012

(51) Int. Cl.
*A61B 5/05* (2006.01)

(52) U.S. Cl.
USPC ........... 600/412; 600/410; 600/411; 324/307; 324/308; 324/309

(58) Field of Classification Search
USPC .................. 600/407, 410–423; 324/300–322
See application file for complete search history.

(56) References Cited

U.S. PATENT DOCUMENTS

| 5,433,717 | A | * | 7/1995 | Rubinsky et al. | 606/20 |
| 5,706,810 | A | * | 1/1998 | Rubinsky et al. | 600/412 |
| 6,032,068 | A | * | 2/2000 | Daniel et al. | 600/412 |
| 6,377,834 | B1 | * | 4/2002 | Zhou et al. | 600/412 |
| 7,850,682 | B2 | * | 12/2010 | Amir et al. | 606/21 |
| 2006/0155267 | A1 | * | 7/2006 | Berzak et al. | 606/20 |
| 2006/0155268 | A1 | * | 7/2006 | Amir et al. | 606/21 |

OTHER PUBLICATIONS

Rothgang et al., "MRI guided cryoablation: In vivo assessment of measuring temperature adjacent to ablated tissue using the PRF method" 8th Interventional MRI Symposium—Book of Abstracts (8th Interventional MRI Symposium), Leipzig, Sep. 24-25, 2010, pp. 39-42, 2010, ISBN 978-3-00-032186-3.*
Georgiadis et al., "Magnetic Resonance Imaging of Water Freezing in Packed Beds Cooled from Below" ACRC Project 58. Oct. 1995, pp. 1-23.*
B.L. Daniel et al., "The Relationship of R2* and Temperature in Frozen Aqueous Tissues", ISMRM Philadelphia 1999, p. 1934.
Sonal Josan, PhD et al., "MRI-Guided Cryoablation: In Vivo Assessment of Focal Canine Prostate Cryolesions", Journal of Magnetic Resonance Imaging 30:169-176 (2009).
Rares Salomir et al., "A Fast Calculation Method for Magnetic Field Inhomogeneity due to an Arbitrary Distribution of Bulk Susceptibility", Concepts in Magnetic Resonance Part B, vol. 19B(1) 26-34, Jul. 7, 2003.

* cited by examiner

*Primary Examiner* — James Kish
(74) *Attorney, Agent, or Firm* — Schiff Hardin LLP

(57) ABSTRACT

In a method or system for magnetic resonance imaging based temperature monitoring for real-time feedback to a physician for a cryoablation therapy of a lesion which creates an ice ball of the lesion to induce cell death, the magnetic resonance imaging system, using proton resonance frequency imaging, obtains a real-time temperature image of the ice ball of the lesion undergoing the cryoablation therapy and the adjacent surrounding tissue. By use of an algorithm, correcting temperature errors at a border of the ice ball are corrected in the real-time image, the temperature error correction correcting susceptibility contrast errors caused by a distortion of the local magnetic field at the border of the ice ball.

6 Claims, 13 Drawing Sheets

$$\Delta T_{corr}\left(\vec{r}\right) = \Delta T_{PRF}\left(\vec{r}\right) + \frac{1}{|\alpha|} \bullet FT^{-1}\left[\left[\left(\frac{1}{3} - \frac{k_z^2}{k_x^2 + k_y^2 + k_z^2}\right) \bullet FT[\Delta x]\right]\right]$$

$$\Delta T_{corr}\left(\vec{r}\right) = \Delta T_{PRF}\left(\vec{r}\right) + \frac{1}{|\alpha|} \cdot FT^{-1}\left[\left[\left(\frac{1}{3} - \frac{k_z^2}{k_x^2 + k_y^2 + k_z^2}\right) \cdot FT[\Delta x]\right]\right]$$

$$T_{PRF}\left(\vec{r}\right) = \frac{\varphi_{frozen} - \varphi_{unfrozen}}{\alpha \cdot \gamma \cdot B_0 \cdot TE}$$

$\varphi\ldots$ MR-phase data
$\alpha\ldots$ thermal coefficient
$TE\ldots$ echo time
$B_0\ldots$ main magnetic field
$\gamma\ldots$ gyromagnetic ratio

FIG. 5

$$\Delta T_{corr}\left(\vec{r}\right) = \Delta T_{PRF}\left(\vec{r}\right) + \frac{1}{|\alpha|} \cdot FT^{-1}\left[\left[\left(\frac{1}{3} - \frac{k_z^2}{k_x^2 + k_y^2 + k_z^2}\right) \cdot FT[\Delta\chi]\right]\right]$$

Convolution in the k-space $K_{x,y,z...}$     k-space coordinates
FT...     Fourier Transformation
$\Delta\chi...$     Susceptibility contrast matrix

FIG. 7

$$\Delta T_{corr}\left(\vec{r}\right) = \Delta T_{PRF}\left(\vec{r}\right) + \frac{1}{|\alpha|} \cdot FT^{-1}\left[\left(\frac{1}{3} - \frac{k_z^2}{k_x^2 + k_y^2 + k_z^2}\right) \cdot FT[\Delta x]\right]$$

⟹ Susceptibility contrast $K_{x,y,z}$... k-space coordinates
FT... Fourier Transformation
$\Delta x$... Susceptibility contrast matrix

FIG. 13

Summary

- Susceptibility contrast is calculated and induced artifacts are corrected
- Temperature error induced by susceptibility contrast between frozen and melted meat is proportional to ice ball volume

| Ice ball volume [mm³] | Ice ball radius [mm] | Max. temp error [°C] |
|---|---|---|
| 13.081 | 10 | 7 |
| 44.148 | 15 | 22 |
| 104.650 | 30 | 50 |

TEMPERATURE MEASUREMENT NEAR AN ICE BALL USING A PROTON RESONANCE FREQUENCY METHOD AND RECALCULATION OF SUSCEPTIBILITY ARTIFACTS

BACKGROUND

Minimally invasive treatments such as Laser-Induced Thermotherapy (LITT), Radiofrequency Ablation (RFA), High Intensity Focused Ultrasound (HIFU) and microwave ablation are commonly used in the clinical setting for the treatment of focal cancers throughout the body. Magnetic Resonance Imaging (MRI) based temperature monitoring is often performed in order to provide real-time feedback to the operating physician, typically using the Proton-Resonance-Frequency (PRF). Another commonly used minimally invasive local tumor therapy is cryoablation, which creates an ice ball to induce cell death. As for high temperature thermal therapies, it is often necessary to monitor temperature changes in real-time during a cryoablation procedure, particularly in at-risk structures adjacent to the target tissue/organ. Currently, temperature monitoring is performed using invasive temperature probes which must be placed by the operator, a time consuming and potentially dangerous procedure. Considerable research was made for non-invasively measuring the sub-zero temperatures within the ice-ball itself using MR. See "MRI-Guided Cryoablation: In Vivo Assessment of Focal Canine Prostate Cryolesions", Josan S, Bouley, Van den Bosch, M., Daniel B L, Butts Pauly K. J Magn Reson Imaging, 2009 Jul. 30 (1): pages 169-176. See also "A Fast Calculation Method for Magnetic Field Inhomogeneity due to an Arbitrary Distribution of Bulk Susceptibility", Salomir et al, Concepts in Magnetic Resonance Part B, Vol. 19B, pages 26-34 (2003).

However, there has been little or no investigation into using MR to measure the near-zero temperatures which are induced around the ice ball. As long as the tissue still contains liquid water, the PRF method should be applicable. However, the ice ball 10 (see FIGS. 1A, 1B) itself disturbs the local magnetic field because of susceptibility contrast with defrosted tissue, which strongly influences the PRF method.

Thus, between the frozen tissue and the not-frozen tissue a difference in susceptibility exists which leads to a distortion of the local magnetic field 11 as shown in the prior art FIG. 1A. This distortion of the local magnetic field in MR temperature-imaging causes an over- or underestimation of the temperature, as shown in FIG. 1B at 8 and 9.

The advantages and disadvantages of cryoblation are thus the following.

The advantages are:
1) much less painful than "burning" techniques—LITT and RFA:
2) the ice ball can be clearly visualized; and
3) the ice ball can be sculpted using multiple probes—to contour complex or large lesions.

The disadvantages are:
1) bleeding (during and after thaw)
2) low signal in the ice ball—research has been done by the group of Kim, Butts, Pauly; and
3) susceptibility artifacts in the MRI phase data around the ice ball—temperature error of ±10° C. for ice ball diameter of 2 cm—important for organs of risk around the ice ball.
See also, Josean S et al. MRI-Guided Cryoablation: "In Vivo Assessment of Focal Canine Prostate Cryolesions." J. Magn. Reson. Imaging 2009:30, pages 169-176.

Thus, the ice ball 10 (see prior art FIGS. 1A, 1B) itself disturbs the local magnetic field "because of susceptibility contrast with the defrosted tissue. As a result, the commonly used Proton Resonance Frequency (PRF) method under- or over-estimates near-zero temperatures as shown at 8 and 9 in FIG. 1B.

SUMMARY OF THE INVENTION

In a method or system for magnetic resonance imaging based temperature monitoring for real-time feedback to a physician for a cryoablation therapy of a lesion which creates an ice ball of the lesion to induce cell death, the magnetic resonance imaging system, using proton resonance frequency imaging, obtains a real-time temperature image of the ice ball of the lesion undergoing the cryoablation therapy and the adjacent surrounding tissue. By use of an algorithm, temperature errors at a border of the ice ball are corrected in the real-time image, the temperature error correction correcting susceptibility contrast errors caused by a distortion of the local magnetic field at the border of the ice ball.

BRIEF DESCRIPTION OF THE DRAWINGS

FIG. 3 shows a convolution in K-space with a kernel for a post-processing first part for correction of phase for susceptibility artifacts;

FIGS. 4-7 show various highlighted parts of the kernel for the correction of the phase for the susceptibility artifacts;

FIG. 13 shows a summary where susceptibility contrast is calculated and induced artifacts are corrected, and also illustrating how the temperature error induced by susceptibility contrast is proportional to ice ball volume.

DESCRIPTION OF THE PREFERRED EMBODIMENT

Figure 1B:
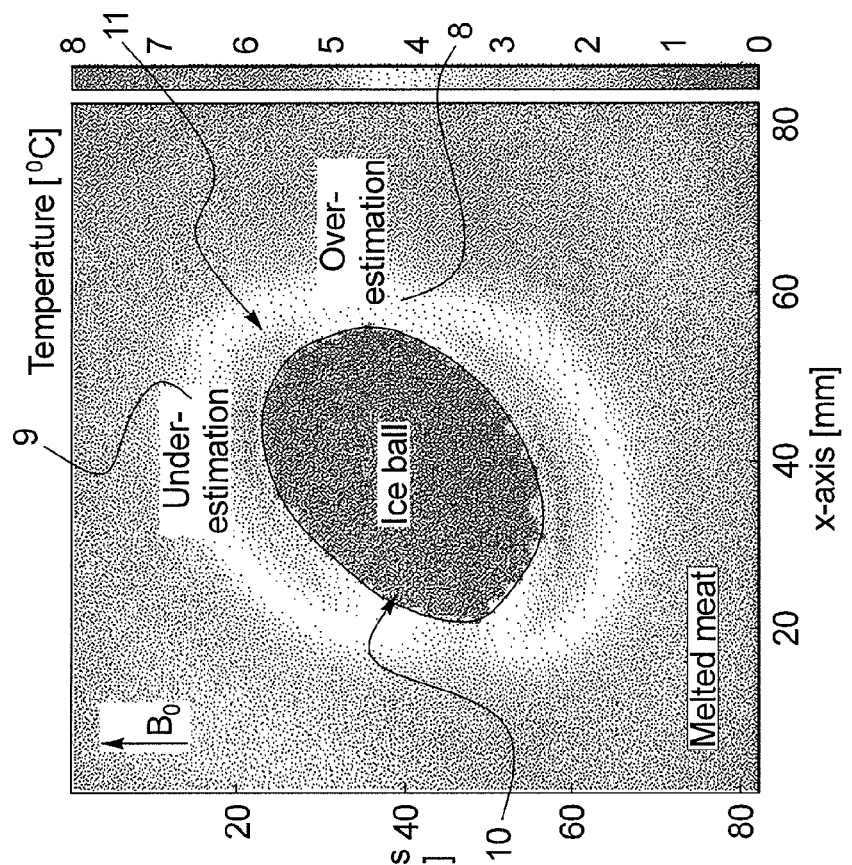
FIG. 1B shows a resulting underestimation and overestimation of temperature outside the boundary of the ice ball.
Figure 1A:
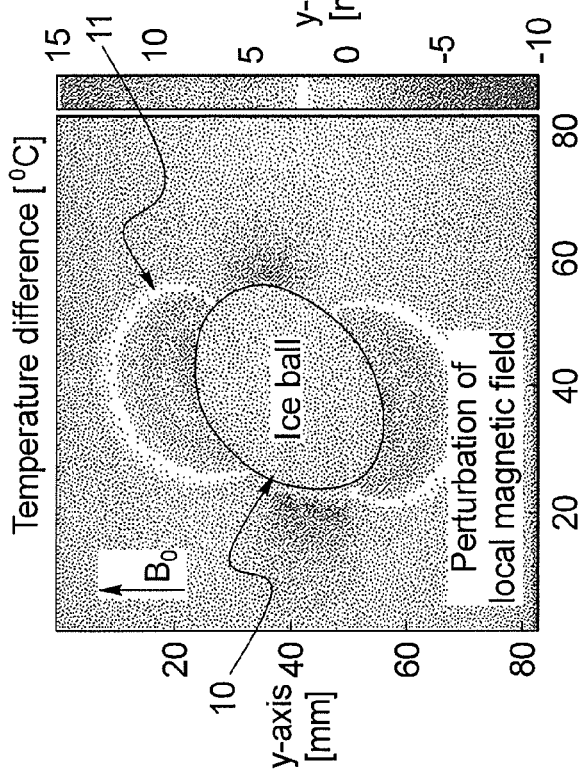
FIG. 1A illustrates how in the prior art an ice ball disturbs a local magnetic field because of susceptibility contrast with defrosted tissue.

For the purposes of promoting an understanding of the principles of the invention, reference will now be made to the preferred method embodiment/best mode illustrated in the drawings and specific language will be used to describe the same. It will nevertheless be understood that no limitation of the scope of the invention is thereby intended, and such alterations and further modifications in the illustrated method and such further applications of the principles of the invention as illustrated as would normally occur to one skilled in the art to which the invention relates are included.

With the method of the preferred embodiment, a post-processing algorithm is provided which simulates susceptibility artifacts and corrects the temperature imaging using the outcome of this simulation.

With the algorithm artifact afflicted temperature imaging is corrected and it is possible to correctly determine the temperature around an ice ball, and also directly at its surface.

A preferred example of an application is the above-described cryotherapy is the Background section above. There malign tissue is destroyed by cooling it to temperatures far beneath 0° C. For the course of the cryotherapy and for the protection of surrounding tissue, it is important to be able to display the temperature in the vicinity of the induced ice ball. Other possible applications are: "Nadler Artifacts" and air bubbles.

In the preferred embodiment method described herein, it is shown that susceptibility artifacts in a GRE phase image induced by an ice ball is corrected, allowing the PRF method to be used to monitor the near zero temperature during cryoablation.

Figure 2:
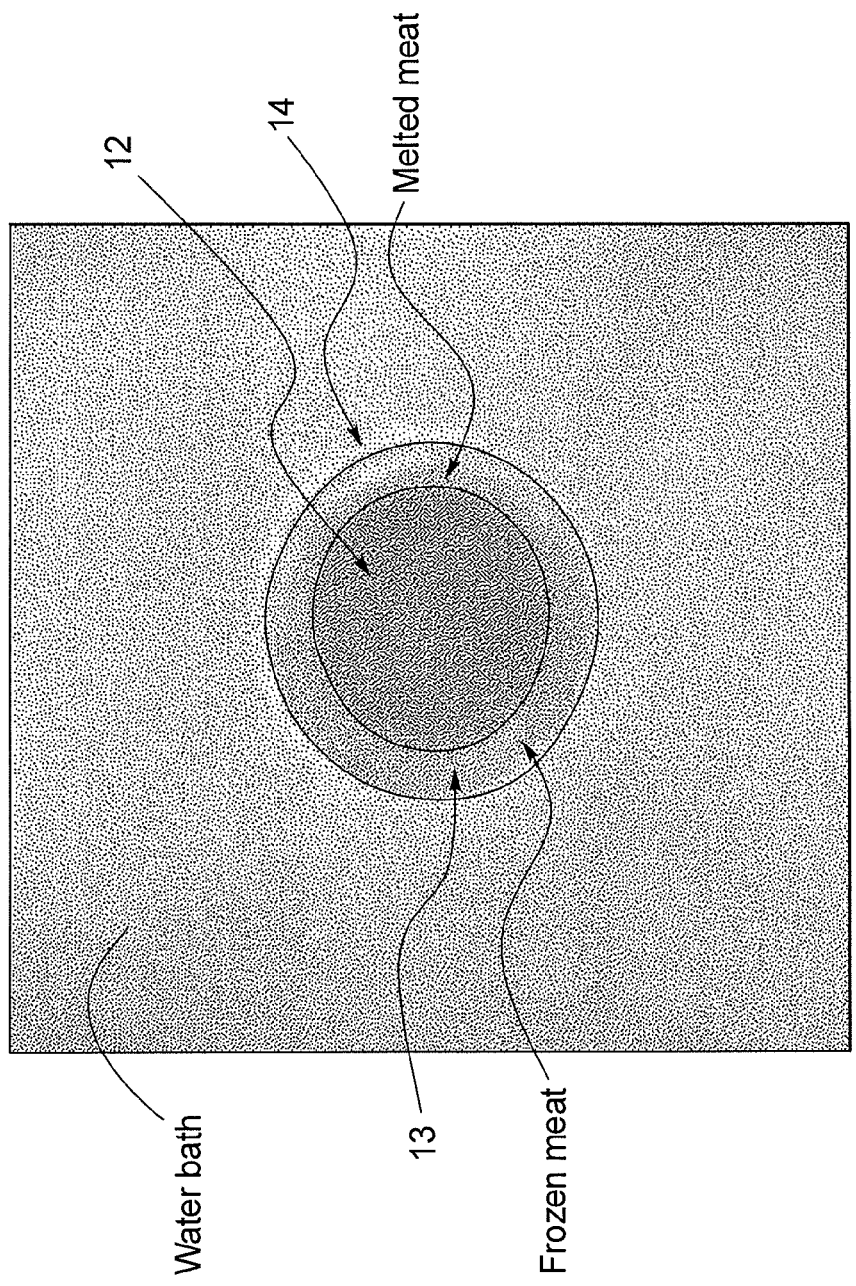
FIG. 2 shows an experimental setup used to determine a recalculation of susceptibility artifacts where frozen meat constitutes the ice ball and melted meat surrounds the frozen meat.

Material and methods will now be described. As shown in FIG. 2, a sample 14 of meat (pork) is frozen in a standard freezer to a temperature of −4° C. and defrosted within a 1.5 T MR-system (Magnetom Avanto, Siemens Erlangen, Germany) using a warm water bath. During the defrosting, repetitive acquisitions are performed using the Gradient Echo sequence (GRE) (TR/TE/TA)=800 ms/40 ms/57, 83 s, 12 slices, slice thickness 2 mm, FOV 300×300 mm$^{2+}$ FOV 300×300 mm$^2$; matrix size 192×192, bandwidth 160 Hz/Px, flip angle 60%). Susceptibility artifacts are then corrected in a post-processing. First, the susceptibility differences between frozen meat 12 and melted meat 13 are determined retrospectively. This value of susceptibility contrast ($\Delta_x$) is explored iteratively by changing it from 0 to 0.5 ppm with steps of 0.005 ppm and searching for the minimum of a cost function. Note that $\Delta_x$ is assigned to the segmented region where the tissue state is changed.

The cost function is defined as the standard deviation of the corrected temperature series—see equation below derived from "A Fast Calculation Method for Magnetic Field Inhomogeneity Due to an Arbitrary Distribution of Bulk Susceptibility"—Salomir R, de Senneville B D, Moonen CTW—Concepts in Magnetic Resonances—2003 (part B), vol 19B (1) pages 26-34. The assumption is that the border of the ice ball must have the water physical state transition temperature, hence a uniform value. In the second step, this knowledge is used to finally correct the GRE phase data for susceptibility artifacts. This method uses a convolution in the k-space with the following kernel also shown in FIG. 3, where a is the temperature PRF coefficient, $k_{x,\,y,\,z}$ the coordinates of the k-space, and FT the Fourier Transformation:

$$\Delta T_{corr}(\vec{r})[° \text{ C.}] = \Delta T_{PRF}(\vec{r})[° \text{ C.}] + \frac{1}{|\alpha|[ppm/° \text{ C.}]} \cdot FT^{-1}\left[\left(\frac{1}{3} - \frac{k_z^2}{k_x^2 + k_y^2 + k_z^2}\right) \cdot FT[\Delta\chi(\vec{r})[ppm]]\right]$$

The above kernel is a part of the post processing for correction of phase for the susceptibility artifacts. FIGS. 3 through 7 show the kernel above with different portions of the kernel being highlighted in FIGS. 4-7 and having parameter definitions.

Figure 6:
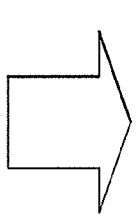

More particularly, FIG. 3 shows the kernel in a post-processing first part for correction of phase for the susceptibility artifacts. FIGS. 4-7 show various parts of the kernel with FIG. 5 showing convolution in the k-space; FIG. 6 showing perturbation field; and FIG. 7 showing susceptibility contrast.

Figure 8:
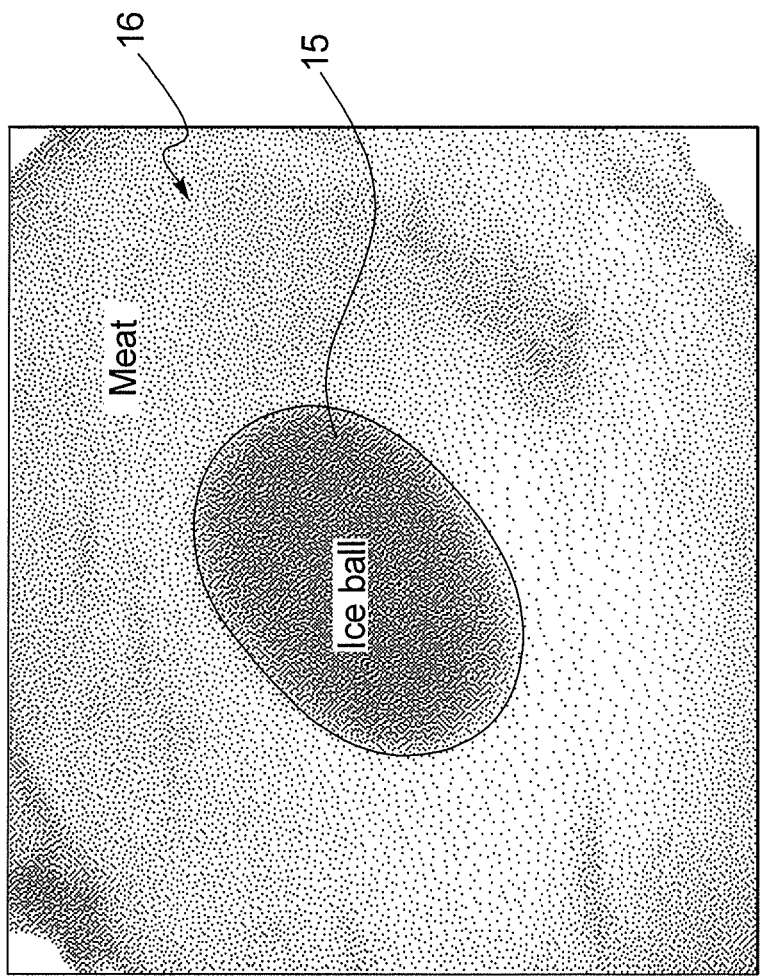
FIGS. 8-11 show various steps in a post-processing second part for determination of susceptibility contrast.
Figure 9:
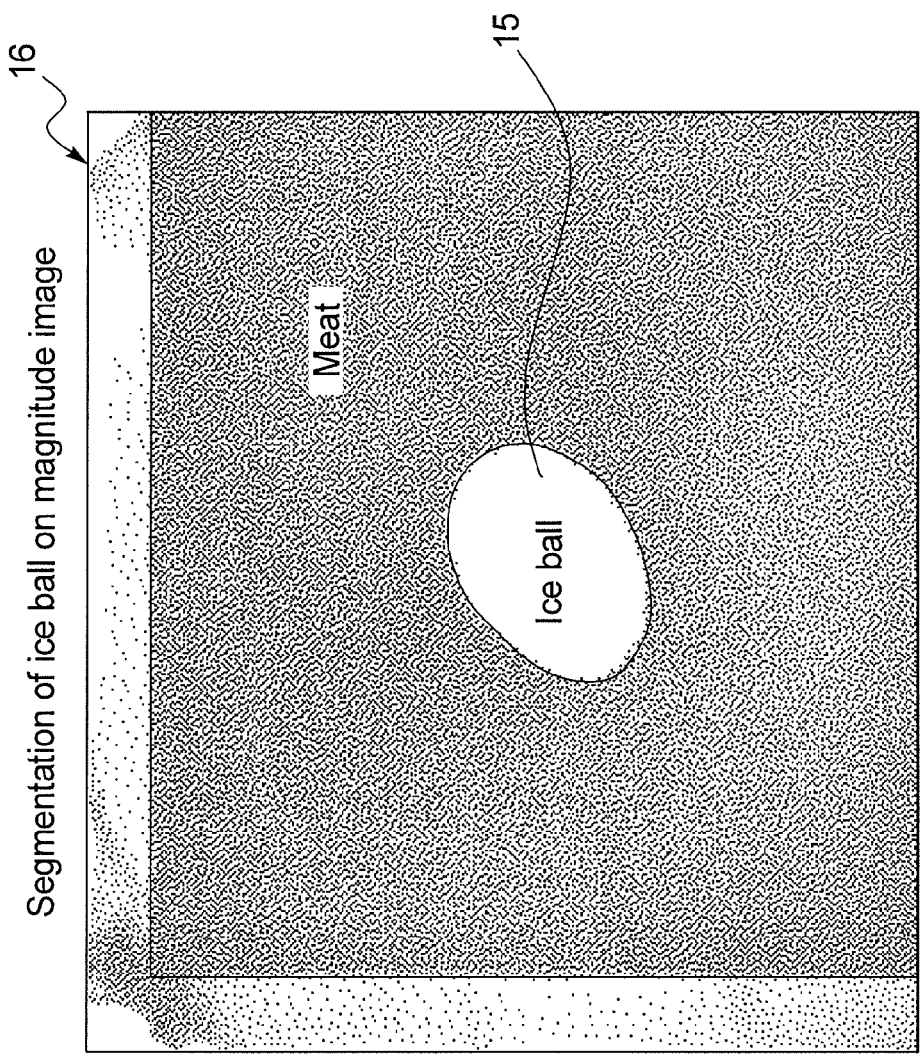
Figure 10:
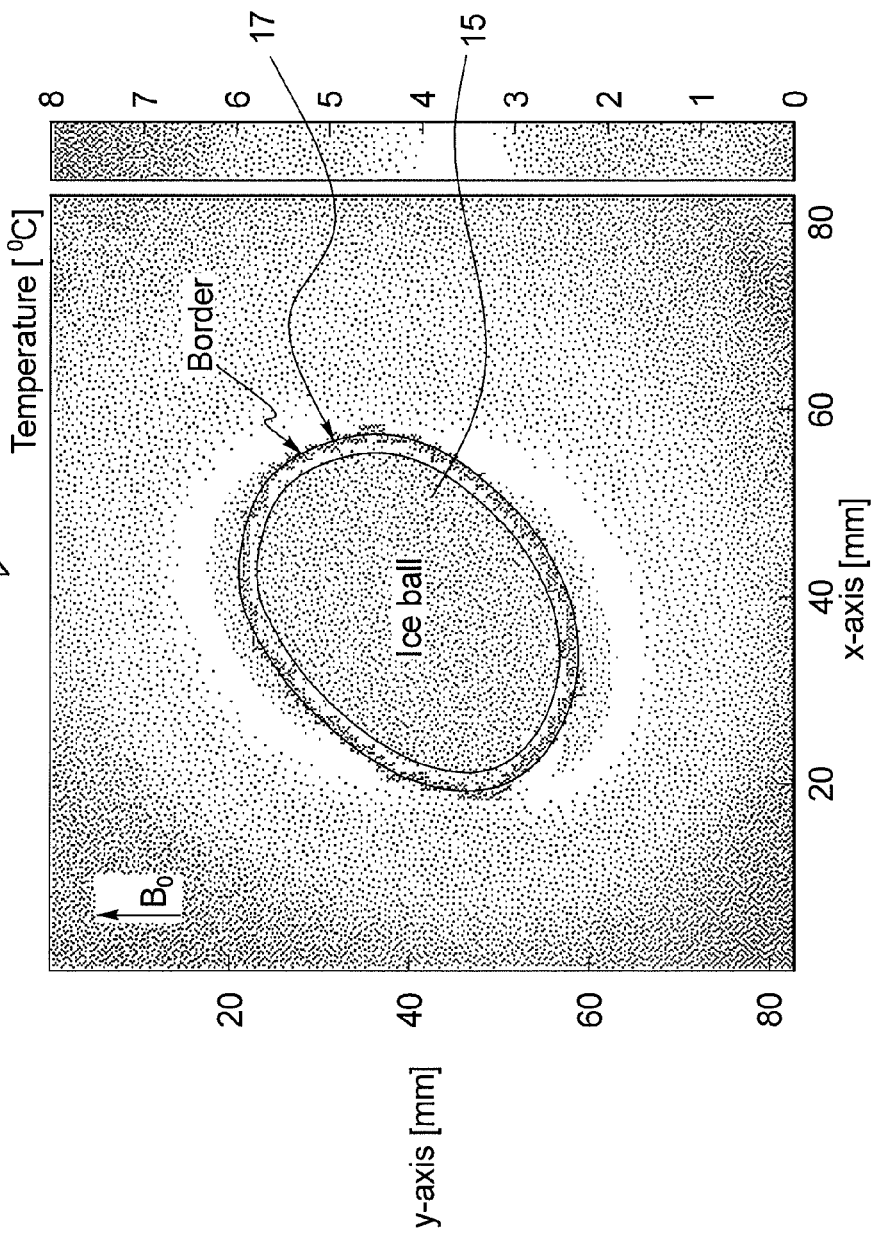
Figure 11:
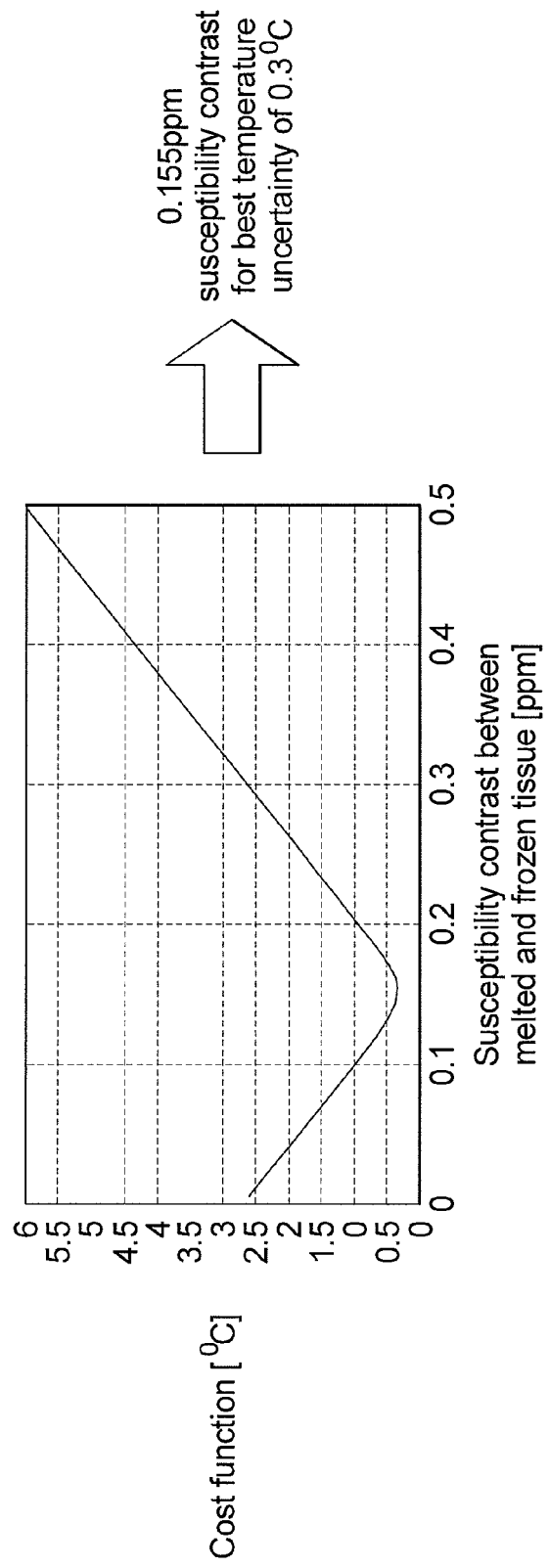

FIGS. 8-11 show a post processing second part for determination of susceptibility contrast. More particularly, FIGS. 8 and 9 show segmentation of the ice ball 15 on a magnitude image 16; FIG. 10 shows the border 17 near the ice ball 15 surface where the same temperature is expected; and FIG. 11 shows determination of the susceptibility contrast definition of a cost function as a standard deviation of corrected temperature on the defined border 17 and searching for the minimum of the cost function.

The results are as follows. The susceptibility difference between melted and frozen tissue is found to be 0.155 ppm for a best-corrected temperature uncertainty of 0.34° C. (FIG. 11). Here, FIG. 11 shows the correlation of the cost function and the explored susceptibility contrast between the melted and the frozen tissue. The cost function is the standard deviation of the spatial series of temperature along the ice ball border 17 in the central slice.

Figure 12:
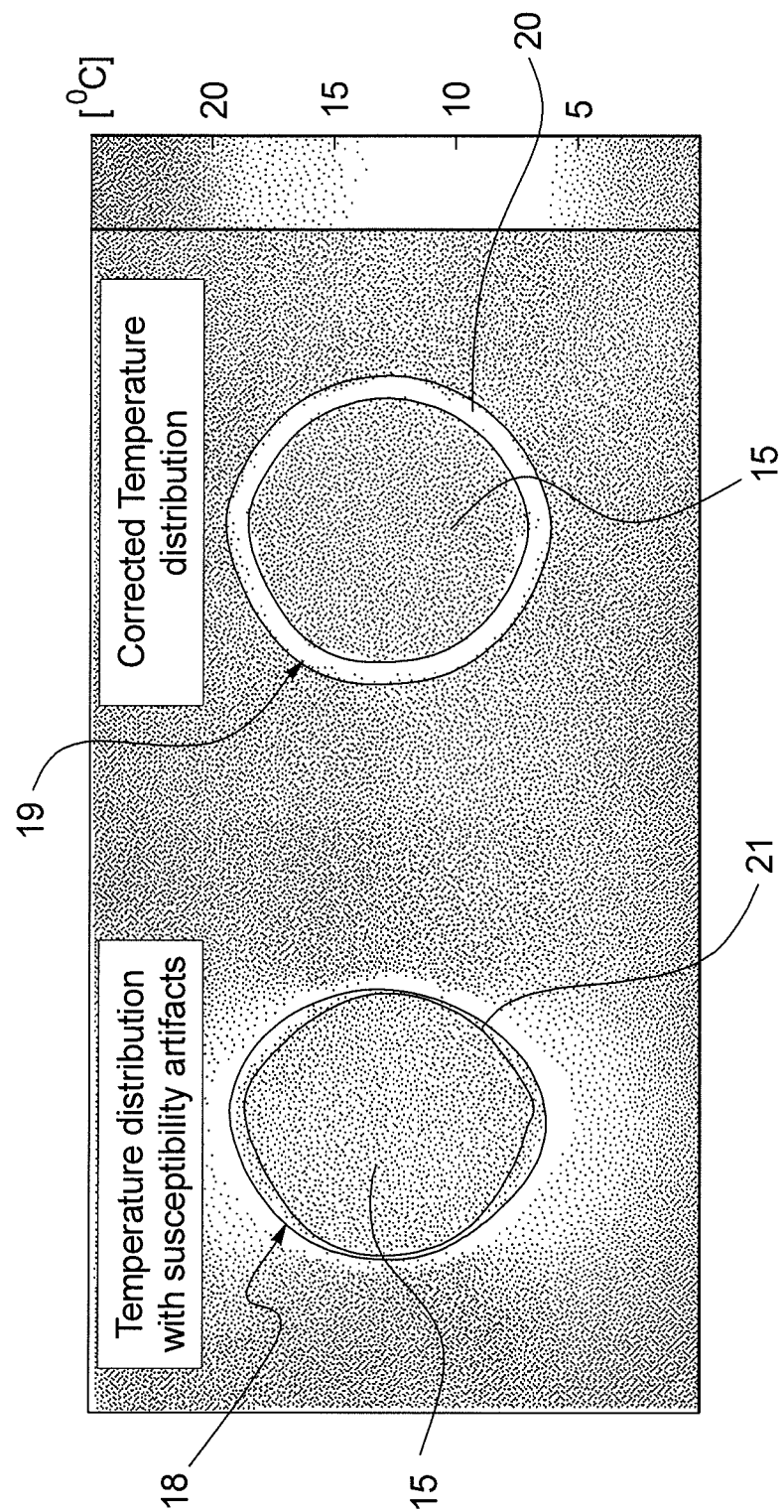
FIG. 12 shows a non-corrected and a corrected temperature image.

FIG. 12 shows a corrected 20 and non-corrected 21 temperature image. Computing time was less than 1 s in Matlab. Visible susceptibility artifacts induced temperature errors of ±6° C. around the ice ball 17 are shown at 18 in FIG. 12. These errors 18 were fully corrected as shown at 19 using the method (FIG. 12). Within the ice ball 15, no MR-signal is obtainable and these temperature values are set to zero.

Thus FIG. 12 shows a comparison of the temperature distribution with (at 21) and without (at 20) the susceptibility artifact measured using the PRF method. See also M. Viallon et al.—Observation and Correction of Transient Cavitation-induced PRFS Thermometry Effects During Radiofrequency Ablation Using Simultaneous Ultrasound/MR Imaging—Am. Assoc. Phys. Med. 2010.

FIG. 13 is a summary showing calculation of the susceptibility contrast whereby induced artifacts are corrected. FIG. 13 also summarizes a temperature error induced by susceptibility contrast between frozen and melted meat, which is proportional to ice ball volume.

The above thus demonstrates a method for correcting the ice ball susceptibility artifacts induced by freezing tissue. Using an in-line post processing system, this method is applied during clinical MR-guided cryotherapy, and allows for the non-invasive monitoring of near zero temperatures to permit the non-invasive monitoring of the near zero temperatures in at risk tissues adjacent to the target lesion.

Although a preferred exemplary method embodiment is shown and described in detail in the drawings and in the preceding specification, it should be viewed as purely exemplary and not as limiting the invention. It is noted that only a preferred exemplary embodiment is shown and described, and all variations and modifications that presently or in the future lie within the protective scope of the invention should be protected.

We claim as our invention:

1. A method for magnetic resonance imaging based temperature monitoring for real-time feedback to a physician for a cryoablation therapy of a lesion which creates an ice ball of the lesion to induce cell death, a border of the ice ball having a water physical state, comprising the steps of:

with a magnetic resonance imaging system, performing proton resonance frequency (PRF) imaging and obtaining a real-time gradient echo sequence (GRE) phase temperature image of the ice ball of the lesion undergoing the cryoablation therapy and surrounding tissue adjacent the lesion;

applying an algorithm to said real-time gradient echo sequence phase temperature image that corrects temperature errors at said border of the ice ball, said temperature error correction correcting susceptibility contrast errors caused by a distortion of a local magnetic field resulting from differences in susceptibility between frozen tissue and non-frozen tissue, said algorithm accounting for the susceptibility differences by simulating susceptibility artifacts, wherein said susceptibility differences are determined by searching for a minimum of a cost function defined as a standard deviation at a corrected temperature series, the border of the ice ball being assumed to have a water physical state transition temperature so that the algorithm corrects phase data for the gradient echo sequence phase temperature image for said susceptibility artifacts; and said algorithm comprising the following $$\Delta T_{corr}(\vec{r})[^\circ C.] = \Delta T_{PRF}(\vec{r})[^\circ C.] + \frac{1}{|\alpha|} \cdot FT^{-1}\left[\left(\frac{1}{3} - \frac{k_z^2}{k_x^2 + k_y^2 + k_z^2}\right) \cdot FT[\Delta_\chi(\vec{r})]\right]$$

wherein $T_{corr}(\vec{R})$ is the corrected temperature, $$T_{PRF}(\vec{r}) = \frac{\phi \text{ frozen} - \phi \text{ unfrozen}}{\alpha \cdot \gamma \cdot B_0 \cdot TE}$$

wherein $\phi$=MR-phase data,
$\alpha$=thermal coefficient,
TE=echo time
$B_0$=main magnetic field,
Y=gyromagnetic ratio,
$k_x$, $k_y$, $k_z$=k-space coordinates
FT=Fourier Transformation, and
$\Delta X$=Susceptibility contrast matrix.

2. The method of claim 1 wherein said algorithm comprises a convolution of a k-space and a perturbation field defined by the susceptibility differences.

3. The method of claim 1 wherein said temperature monitoring comprises non-invasive monitoring of near zero temperatures at tissues adjacent to the lesion.

4. The method of claim 1 wherein said lesion comprises a tumor.

5. The method of claim 1 wherein said algorithm comprises a convolution in k-space that has a susceptibility contrast matrix.

6. A system for magnetic resonance imaging based temperature monitoring for real-time feedback to a physician for a cyroablation therapy of a lesion which creates an ice ball of the lesion to induce cell death, a border of the ice ball having a water physical state, comprising:

a magnetic resonance imaging system configured to perform proton resonance frequency imaging to obtain a real-time gradient echo sequence (GRE) temperature image of the ice ball of the lesion undergoing the cryoablation therapy and adjacent surrounding tissue the lesion;

said magnetic resonance imaging system configured to use an algorithm to correct temperature errors at said border of the ice ball in the real-time image, said temperature error correction correcting for susceptibility contrast errors caused by a distortion of a local magnetic field resulting from differences in susceptibility between frozen tissue and non-frozen tissue, said algorithm accounting for the susceptibility differences by simulating susceptibility artifacts, said susceptibility differences being determined by searching for a minimum of a cost function defined as a standard deviation at a corrected temperature series, said border of the ice ball being assumed to have a water physical state transition temperature so that the algorithm corrects phase data for the gradient echo sequence temperature image for said susceptibility artifacts; and said algorithm comprising the following $$\Delta T_{corr}(\vec{r})[^\circ C.] = \Delta T_{PRF}(\vec{r})[^\circ C.] + \frac{1}{|\alpha|} \cdot FT^{-1}\left[\left(\frac{1}{3} - \frac{k_z^2}{k_x^2 + k_y^2 + k_z^2}\right) \cdot FT[\Delta_\chi(\vec{r})]\right]$$

wherein $T_{corr}(\vec{R})$ is the corrected temperature, $$T_{PRF}(\vec{r}) = \frac{\phi \text{ frozen} - \phi \text{ unfrozen}}{\alpha \cdot \gamma \cdot B_0 \cdot TE}$$

wherein $\phi$=MR-phase data,
$\alpha$=thermal coefficient,
TE=echo time
$B_0$=main magnetic field,
Y=gyromagnetic ratio,
$k_x$, $k_y$, $k_z$=k-space coordinates
FT=Fourier Transformation, and
$\Delta X$=Susceptibility contrast matrix.

* * * * *